United States Patent
Singh et al.

(10) Patent No.: US 11,508,810 B2
(45) Date of Patent: Nov. 22, 2022

(54) DIODE STRUCTURES

(71) Applicant: GLOBALFOUNDRIES INC., Grand Cayman (KY)

(72) Inventors: Jagar Singh, Clifton Park, NY (US); Shiv Kumar Mishra, Mechanicville, NY (US)

(73) Assignee: GLOBALFOUNDRIES INC., Malta, NY (US)

( * ) Notice: Subject to any disclaimer, the term of this patent is extended or adjusted under 35 U.S.C. 154(b) by 221 days.

(21) Appl. No.: 17/097,425

(22) Filed: Nov. 13, 2020

(65) Prior Publication Data

US 2021/0066450 A1 Mar. 4, 2021

Related U.S. Application Data

(63) Continuation of application No. 16/382,718, filed on Apr. 12, 2019, now Pat. No. 10,896,953.

(51) Int. Cl.
*H01L 29/06* (2006.01)
*H01L 29/872* (2006.01)
*H01L 27/06* (2006.01)

(52) U.S. Cl.
CPC ...... *H01L 29/0623* (2013.01); *H01L 27/0629* (2013.01); *H01L 29/0646* (2013.01); *H01L 29/872* (2013.01)

(58) Field of Classification Search
CPC .............. H01L 29/0619; H01L 29/0646; H01L 29/0623; H01L 29/8725; H01L 29/66136;
(Continued)

(56) References Cited

U.S. PATENT DOCUMENTS 8,421,181 B2 * 4/2013 Anderson ............. H01L 29/872
438/570
8,878,329 B2 * 11/2014 Tsai ...................... H01L 29/872
257/454
(Continued)

FOREIGN PATENT DOCUMENTS

CN 106531837 A * 3/2017 ..... H01L 31/035272
CN 108039390 A * 5/2018
(Continued)

OTHER PUBLICATIONS

Singh et al., "Analog, RF, and ESD device challenges and solutions for 14nm FinFET technology and beyond", IEEE, 2014 Symposium on VLSI Technology (VLSI-Technology): Digest of Technical Papers, Sep. 11, 2014, 2 pages.

*Primary Examiner* — Errol V Fernandes
*Assistant Examiner* — Jeremy J Joy
(74) *Attorney, Agent, or Firm* — Francois Pagette; Andrew M. Calderon; Calderon Safran & Cole, P.C.

(57) ABSTRACT

The present disclosure relates to semiconductor structures and, more particularly, to high voltage diode structures and methods of manufacture. The structure includes: a diode structure composed of first well of a first dopant type in a substrate; and a well ring structure of the first dopant type in the substrate which completely surrounds the first well of the first dopant type, and spaced a distance "x" from the first well to cut a leakage path to a shallower second well of a second dopant type.

20 Claims, 4 Drawing Sheets

(58) Field of Classification Search
CPC ........... H01L 29/8611; H01L 29/66143; H01L 29/66212; H01L 29/872; H01L 27/0629
See application file for complete search history.

(56) References Cited

U.S. PATENT DOCUMENTS

| | | | |
|---|---|---|---|
| 8,928,083 B2 | 1/2015 | Chang et al. | |
| 9,324,827 B1 | 4/2016 | Singh | H01L 29/0649 |
| 9,705,010 B2 | 7/2017 | Pang | H01L 21/762 |
| 9,887,302 B2* | 2/2018 | Lin | H01L 21/762 |
| 9,935,231 B2* | 4/2018 | Roehrer | H01L 31/107 |
| 10,276,652 B1* | 4/2019 | Yang | H01L 29/0692 |
| 10,685,953 B2* | 6/2020 | Kim | H01L 27/0922 |
| 2004/0155300 A1* | 8/2004 | Baird | H01L 27/0266 257/380 |
| 2008/0135970 A1* | 6/2008 | Kim | H01L 29/402 257/E29.338 |
| 2008/0197408 A1 | 8/2008 | Disney | H01L 29/7811 257/335 |
| 2008/0197446 A1 | 8/2008 | Disney | H01L 21/761 257/506 |
| 2008/0237704 A1* | 10/2008 | Williams | H01L 29/7835 257/E21.546 |
| 2009/0166795 A1* | 7/2009 | Yoon | H01L 29/66143 438/424 |
| 2009/0236679 A1* | 9/2009 | Chiang | H01L 29/872 257/E29.338 |
| 2009/0268361 A1 | 10/2009 | Mallikarjunaswamy | H01L 29/7436 361/56 |
| 2010/0019295 A1* | 1/2010 | Henderson | H01L 31/107 257/E27.122 |
| 2010/0032794 A1* | 2/2010 | Pendharkar | H01L 29/66136 257/509 |
| 2010/0155829 A1 | 6/2010 | Jang | H01L 29/0649 257/328 |
| 2010/0245809 A1* | 9/2010 | Andreou | H01L 31/107 257/292 |
| 2012/0018837 A1* | 1/2012 | Anderson | H01L 29/872 438/420 |
| 2012/0068297 A1* | 3/2012 | Tsai | H01L 29/782 257/474 |
| 2012/0074515 A1* | 3/2012 | Chen | H01L 23/66 257/491 |
| 2012/0086099 A1* | 4/2012 | Yeh | H01L 29/0692 438/534 |
| 2012/0091530 A1 | 4/2012 | Campi, Jr. | H01L 27/0274 257/360 |
| 2013/0069154 A1* | 3/2013 | Tsuchiko | H01L 29/66659 257/E29.171 |
| 2013/0193546 A1* | 8/2013 | Webster | H01L 31/02363 257/438 |
| 2013/0285208 A1 | 10/2013 | Standaert et al. | |
| 2014/0159206 A1* | 6/2014 | Hsu | H01L 27/0262 438/514 |
| 2014/0242762 A1* | 8/2014 | Chen | H01L 27/0629 438/195 |
| 2015/0054117 A1 | 2/2015 | Mishra | H01L 29/0619 257/487 |
| 2015/0084154 A1* | 3/2015 | Hsu | H01L 21/265 257/491 |
| 2015/0179779 A1* | 6/2015 | Liao | H01L 29/0692 438/335 |
| 2015/0364471 A1* | 12/2015 | Chang | H01L 27/0928 257/338 |
| 2016/0020203 A1 | 1/2016 | Zhang et al. | |
| 2016/0064475 A1 | 3/2016 | Feilchenfeld | H01L 29/66136 257/484 |
| 2016/0308071 A1 | 10/2016 | Lin | H01L 29/0619 |
| 2017/0054037 A1* | 2/2017 | Lin | H01L 21/2253 |
| 2017/0179306 A1* | 6/2017 | Hsiao | H01L 29/8725 |
| 2017/0229598 A1* | 8/2017 | Roehrer | H01L 31/107 |
| 2018/0190493 A1* | 7/2018 | Kumar | H01L 21/324 |
| 2018/0301583 A1* | 10/2018 | Lo | H01L 31/107 |
| 2018/0342497 A1* | 11/2018 | Kim | H01L 27/0922 |
| 2019/0214508 A1 | 7/2019 | Kim | H01L 29/0619 |

FOREIGN PATENT DOCUMENTS

| | | | | |
|---|---|---|---|---|
| CN | 105185796 B | * | 6/2018 | |
| CN | 106847960 B | * | 4/2019 | |
| CN | 109638092 A | * | 4/2019 | |
| EP | 2144303 A1 | * | 1/2010 | ........... H01L 31/107 |

* cited by examiner

DIODE STRUCTURES

FIELD OF THE INVENTION

The present disclosure relates to semiconductor structures and, more particularly, to high voltage diode structures and methods of manufacture.

BACKGROUND

Non-transistor field effect transistor (FET) elements, such as capacitors and diodes, are important elements in complementary metal-oxide semiconductor (CMOS) technology, Current P+/Nwell or N+/Pwell diodes are designed for a maximum of about 5 V voltage operation. Beyond the 5V, these devices exhibit significant high voltage leakage path. This high voltage leakage path has been found to occur under the shallow trench isolation (STI) regions covered by a gate structure. High leakage current under the STI region is considered as a parasitic diode. Accordingly, for such devices, the breakdown voltage is pinned to around 8 V due to parasitic diode leakage under the gate STI region.

SUMMARY

In an aspect of the disclosure, a structure comprises: a diode structure composed of first well of a first dopant type in a substrate; and a well ring structure of the first dopant type in the substrate and which completely surrounds the first well of the first dopant type, and spaced a distance "x" from the first well to cut a leakage path to a shallower second well of a second dopant type.

In an aspect of the disclosure, a diode structure comprises: a first N-well in a substrate; a N+ contact over the first N-well; shallow trench isolation regions surrounding the first N-well and the N+ contact; an N-type ring structure in the substrate which completely surrounds the first N-well and the N+ contact, the N-type ring structure being spaced a distance "x" from the first N-well; and a P-type well in the substrate.

In an aspect of the disclosure, a diode structure comprises: a deep N-well in a substrate; an N-well in the substrate located over the deep N-well; a N+ contact in the substrate located over the first N-well; shallow trench isolation regions surrounding the N-well and the N+ contact; an N-type ring structure in the substrate which completely surrounds the first N-well and the N+ contact and the deep N-well, the N-type ring structure being spaced a distance "x" from the deep N-well; a P-type well in the substrate; gate structures over the N+ contact; and contacts in direct contact with the N+ contact, between the gate structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to high voltage diode structures and methods of manufacture. More specifically, the present disclosure relates to finFET high voltage diodes which can achieve high voltage operation, and methods of manufacture. Advantageously, the present disclosure provides structures with high operating voltage by cutting the leakage path and hence increasing the breakdown voltage of the junctions in FinFET technology.

In embodiments, the diode structure described herein includes an added n-well ring which acts as a barrier to current flow and which increases the breakdown voltage. The spacing between the n-well ring and diode region can be different values to provide a full depletion in the region and, hence, higher resistance to current flow. The n-well ring also acts as minority carrier sinkers which, in turn, provides a better noise suppression to a device sitting in the n-well or p-well regions. The diode structure can include the implant (n-well ring) in the case of P+/N well diode. N-well rings can also be in increasing numbers to provide for more robust isolation, i.e., more rings to support higher voltage device operation.

The high voltage diodes of the present disclosure can be manufactured in a number of ways using a number of different tools. In general, though, the methodologies and tools are used to form structures with dimensions in the micrometer and nanometer scale. The methodologies, i.e., technologies, employed to manufacture the high voltage diodes of the present disclosure have been adopted from integrated circuit (IC) technology. For example, the structures are built on wafers and are realized in films of material patterned by photolithographic processes on the top of a wafer. In particular, the fabrication of the high voltage diodes uses three basic building blocks: (i) deposition of thin films of material on a substrate, (ii) applying a patterned mask on top of the films by photolithographic imaging, and (iii) etching the films selectively to the mask.

Figure 1A:
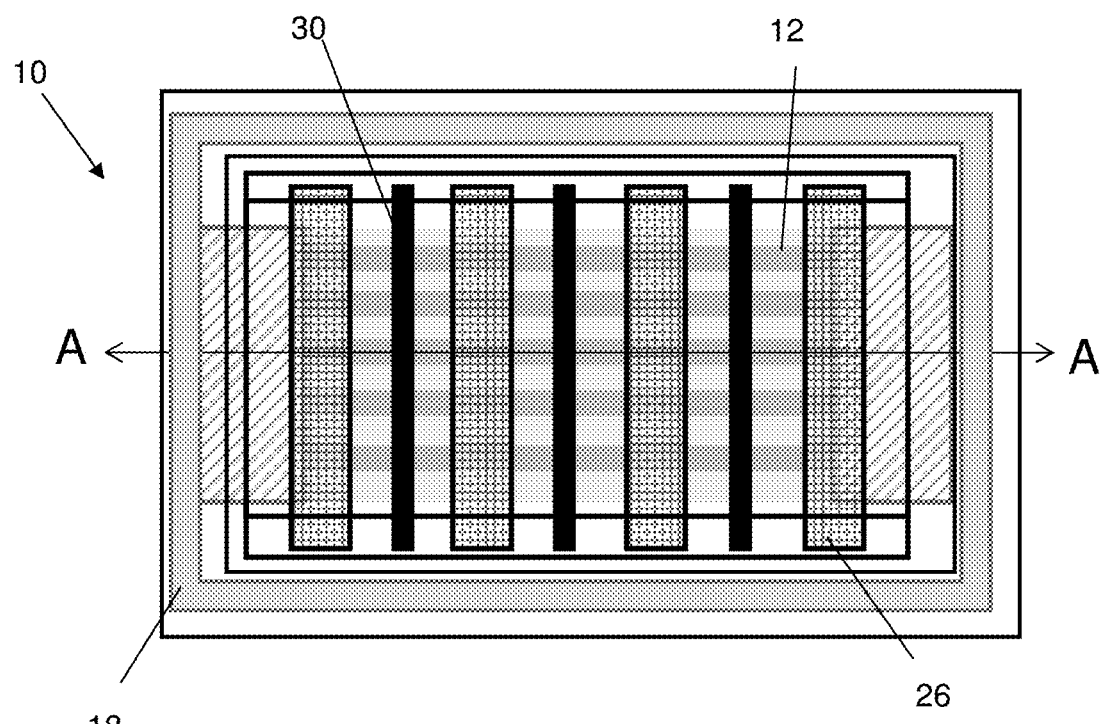
FIG. 1A shows a top view of a diode structure, amongst other features, and respective fabrication processes in accordance with aspects of the present disclosure.
Figure 1B:
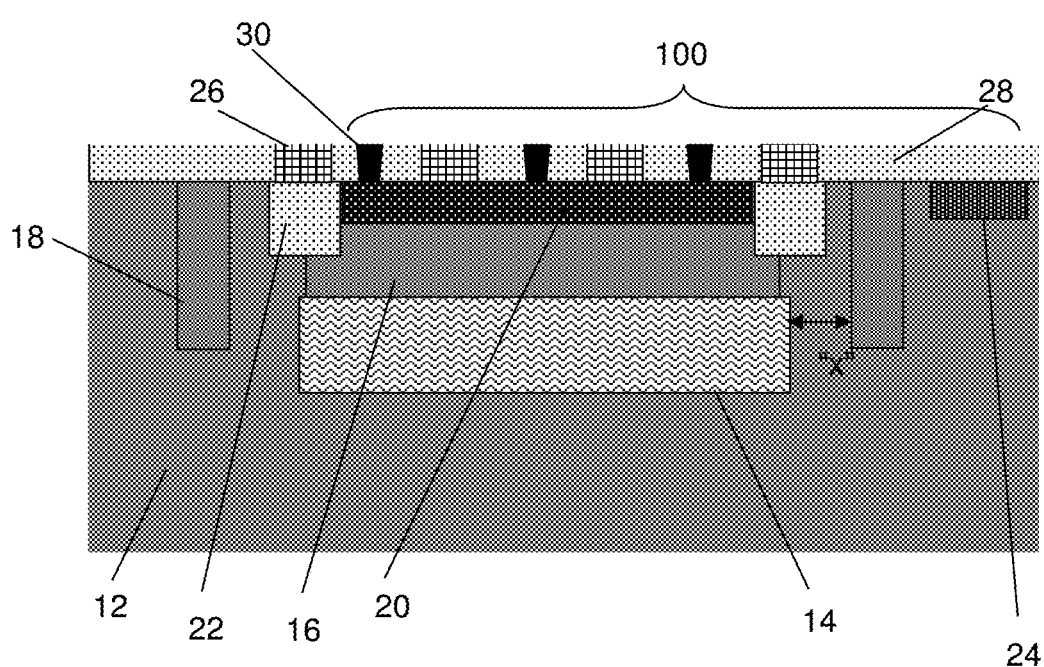
FIG. 1B shows a cross-sectional view of FIG. 1 along line A-A.

FIG. 1A shows a top view of a diode structure, amongst other features, and respective fabrication processes in accordance with aspects of the present disclosure. FIG. 1B shows a cross-sectional view of FIG. 1 along line A-A. Referring to FIGS. 1A and 1B, the structure 10 includes a substrate 12. In embodiments, the substrate 12 may be composed of any suitable material including, but not limited to, Si, SiGe, SiGeC, SiC, alloys, GaAs, InAs, InP, and other III/V or II/VI compound semiconductors. In embodiments, the substrate 12 can be representative of a fin structure.

The fin structure can be fabricated using conventional lithography and etching processes, including sidewall image transfer (SIT) techniques. In an example of a SIT technique, a mandrel material, e.g., $SiO_2$, is deposited on the substrate 12 using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the fin structures. Spacers are formed on the sidewalls of the mandrels which are preferably material that is different than the mandrels, and which are formed using conventional deposition processes known to those of skill in the art. The spacers can have a width which matches the dimensions of the fin structures, for example. The mandrels are removed or stripped using a conventional etching process, selective to the mandrel material. An etching is then performed within the spacing of the spacers to form the sub-lithographic features. The sidewall spacers can then be stripped.

In embodiments, the substrate 12 includes a deep well structure 14 fabricated using ion implantation processes. For example, the deep well structure 14 can be an N-well structure formed by a phosphorous implantation process, e.g., at an energy of 520 KeV and a dosage of 2e13 as one non-limiting illustrative example. An N-well 16 and N-well ring 18 are also formed in the substrate 12. In embodiments, the N-well 16 and N-well ring 18 can be formed in a single implantation step or separate implantation steps. By way of example, the N-well 16 and N-well ring 18 can be formed by an ion implantation process using phosphorous, e.g., at an energy of 120 KeV and a dosage of 2e13 as one non-limiting illustrative example. The N-well 16 and N-well ring 18 will be shallower (in the substrate 12) than the deep well structure 14.

The N-well ring 18 will completely surround (as shown in FIG. 1A) and will partially overlap in depth with the deep well structure 14 (as shown in FIG. 1B). In embodiments, as shown in both FIGS. 1A and 1B, the N-well ring 18 will be spaced away from the deep well structure 14 or the N-well 16 (e.g., N-well diode junction) by a distance "x". In embodiments, the spacing "x" can vary depending on the desired breakdown voltage. Specifically, the spacing "x" can be approximately 50 nm to approximately 2 microns; although other distances are contemplated which would allow the N-well ring to stop a leakage path from the N-well regions. The breakdown voltage can be increased by a larger spacing between the N-well ring 18 and the deep well structure 14. For example, in simulations, a 0.3 micron spacing shows a breakdown voltage of 15.5 V, which is higher than a baseline case of 8.0 V in conventional structures as discussed in more detail below. Again, it is emphasized, though, that the spacing "x" can be variable from 50 nm to approximately 2 microns, as examples.

Still referring to FIGS. 1A and 1B, a N+ contact 20 is formed over the N-well 16. The N+ contact 20 is a top level contact (e.g., anode) for the diode structure 100, for example. Shallow trench isolation (STI) structures 22 are formed around the N+ contact 16, extending partially into a depth of the N-well 16. In embodiments, the STI structures 22 will be within the confines of the N-well ring 18 of the diode structure 100.

In embodiments, the STI structures 22 can be formed by conventional lithography, etching and deposition methods known to those of skill in the art. For example, a resist formed over the substrate 12 is exposed to energy (light) to form a pattern (opening). An etching process with a selective chemistry, e.g., reactive ion etching (RIE), will be used to form one or more trenches in the substrate 12 through the openings of the resist. The resist can then be removed by a conventional oxygen ashing process or other known stripants. Following the resist removal, insulator material, e.g., oxide, can be deposited by any conventional deposition processes, e.g., chemical vapor deposition (CVD) processes. Any residual insulator material on the surface of the substrate 12 can be removed by conventional chemical mechanical polishing (CMP) processes.

FIG. 1B further show a P+ well 24 formed within the substrate 12. In embodiments, the P+ well 24 is a shallow well acting as an anode for the diode 100. The P+ well 24 can be formed by conventional ion implantation processes, e.g., using boron. In embodiments, the P+ well (anode) 24 will be shallower than the N-well ring 18. Gate structures (transistors) 26 are formed on the substrate 12, over the N+ contact 16 (cathode) and the STI structures 22. The gate structures 26 are formed by conventional deposition and patterning processes such that no further explanation is required herein for a complete understanding of the present disclosure.

In embodiments, the gate structures 26 can be fabricated from a high-k gate dielectric material, e.g., $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The gate structure 26 can be fabricated with different metallization features, e.g., workfunction metals. Examples of the workfunction materials for an n-channel FET include TiN, TaN, TaAlC, TiC, TiAl, TaC, Co, Al, TiAl, HfTi, TiSi, TaSi or TiAlC. In one embodiment, TaAlC, TiAl or Al is used for an n-channel FET. It should be understood, though, that if the PET is an n-channel or nFET, then the source and drain are n+ regions and the body is a p region. If the FET is a p-channel or pFET, then the source and drain are p+ regions and the body is a n region.

Still referring to FIGS. 1A and 1B, a dielectric material 28 is deposited over the gate structures 16. In embodiments, the dielectric material 28 is an interlevel dielectric material that can be deposited by a CVD process, followed by a chemical mechanical planarization (CMP) process. A plurality of contacts 30 are provided in the interlevel dielectric material 28, which contact the N+ contact 20. The contacts 30 are formed by conventional lithography, etching and deposition processes.

As should be now understood, the combination of the deep well structure 14 and N-well ring 18 will effectively push the current flow deeper into the substrate 12 to prevent leakage from the diode structure 100. Accordingly, the combination of the deep well structure 14 and N-well ring 18 provides a low off state leakage current. The diode structure 100 also exhibits a high on state current as it allows contribution from the sidewalls. Moreover, it should be understood that the breakdown of the diode structure 100 is limited to the gated diode leakage near to the surface underneath the STI region 22.

Figure 2:
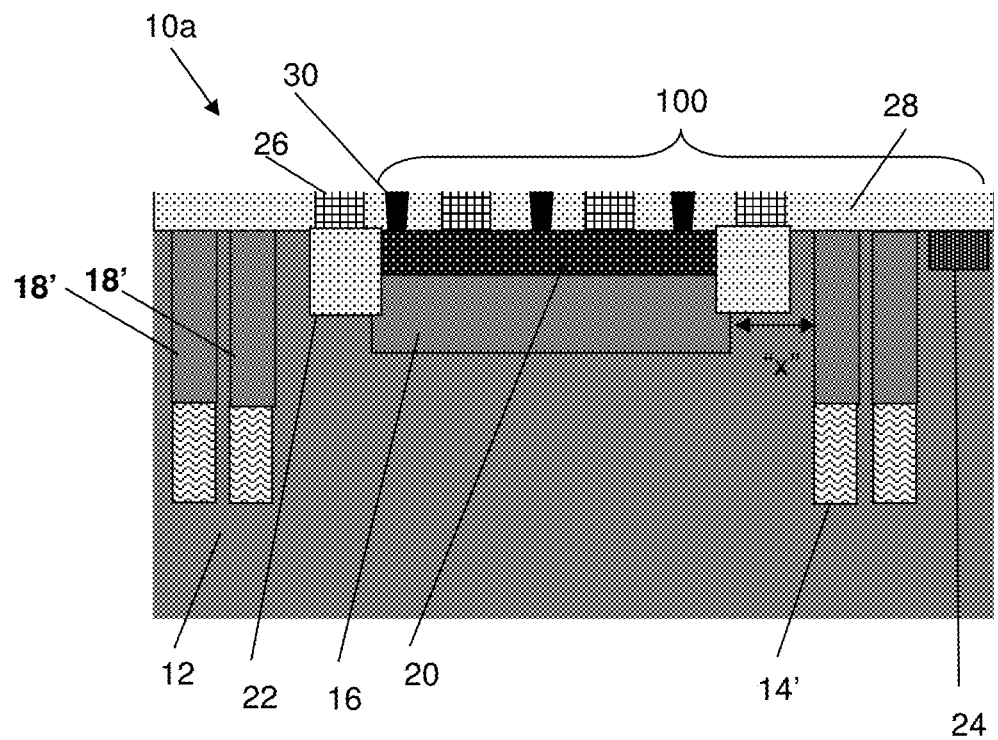
FIG. 2 shows a cross-sectional view of a diode structure, amongst other features, and respective fabrication processes in accordance with additional aspect of the present disclosure.

FIG. 2 shows a cross-sectional view of a diode structure, amongst other features, and respective fabrication processes in accordance with additional aspect of the present disclosure. In the structure 10a of FIG. 2, two N-well rings 18' are provided around the diode structure 100. In this embodiment, the diode structure 100 does not include the deep well structure; however, the N-well rings 18' now include the deep well implants 14'. In embodiments, two or more N-well rings 18' are contemplated herein. Also, the spacing "x" exists between the innermost N-well rings and the n-wells 16.

Figure 3:
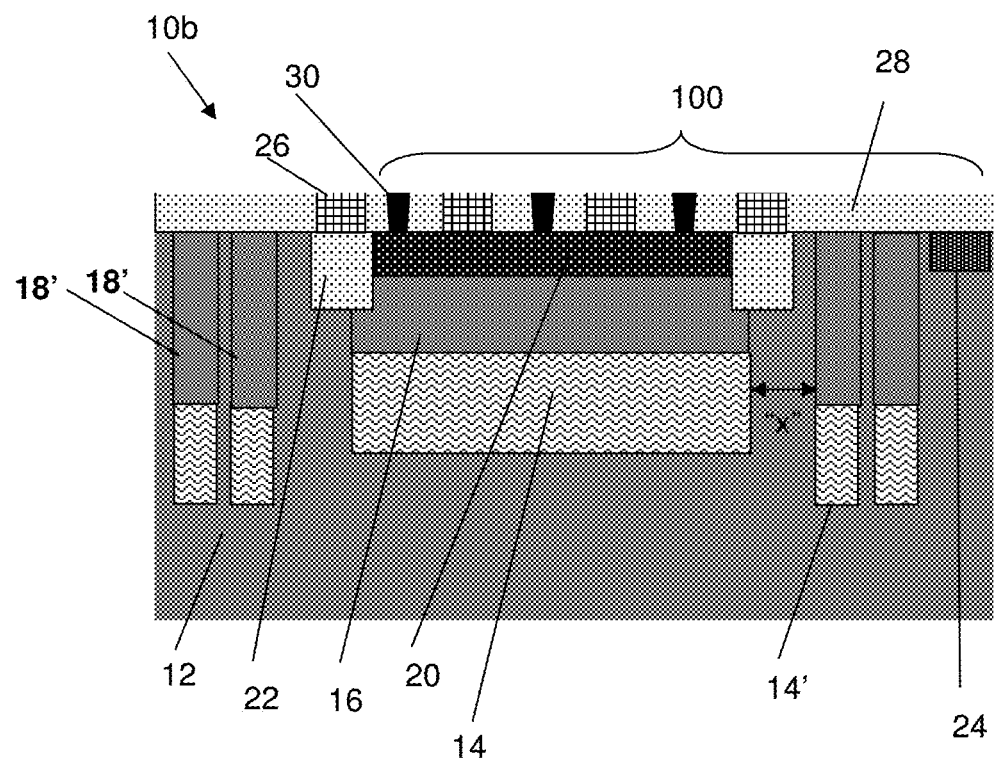
FIG. 3 shows a cross-sectional view of a diode structure, amongst other features, and respective fabrication processes in accordance with another aspect of the present disclosure.

FIG. 3 shows a cross-sectional view of a diode structure, amongst other features, and respective fabrication processes in accordance with another aspect of the present disclosure. In the structure 10b of FIG. 3, two N-well rings 18' are provided around the diode structure 100. In this embodiment, the diode structure 100 and the N-well rings 18' now include the deep well implants 14, 14'. In embodiments, two or more N-well rings 18' are contemplated herein.

Figure 4:
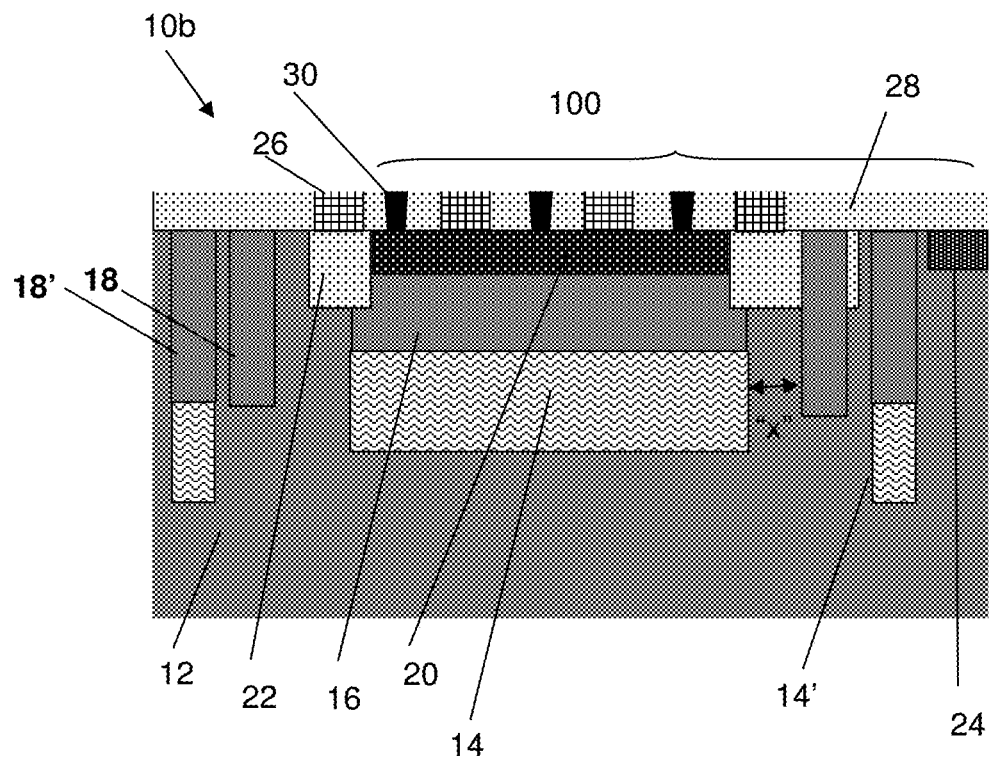
FIG. 4 shows a cross-sectional view of a diode structure, amongst other features, and respective fabrication processes in accordance with yet another aspect of the present disclosure.

FIG. 4 shows a cross-sectional view of a diode structure, amongst other features, and respective fabrication processes in accordance with yet another aspect of the present disclosure. In the structure 10c of FIG. 4, two N-well rings 18' are provided around the diode structure 100. In this embodiment, though, only one of the N-well rings 18' (e.g., outer ring) includes the deep well structure implant 14'. The inner N-well ring 18 can be provided through the STI region 22.

Figure 5:
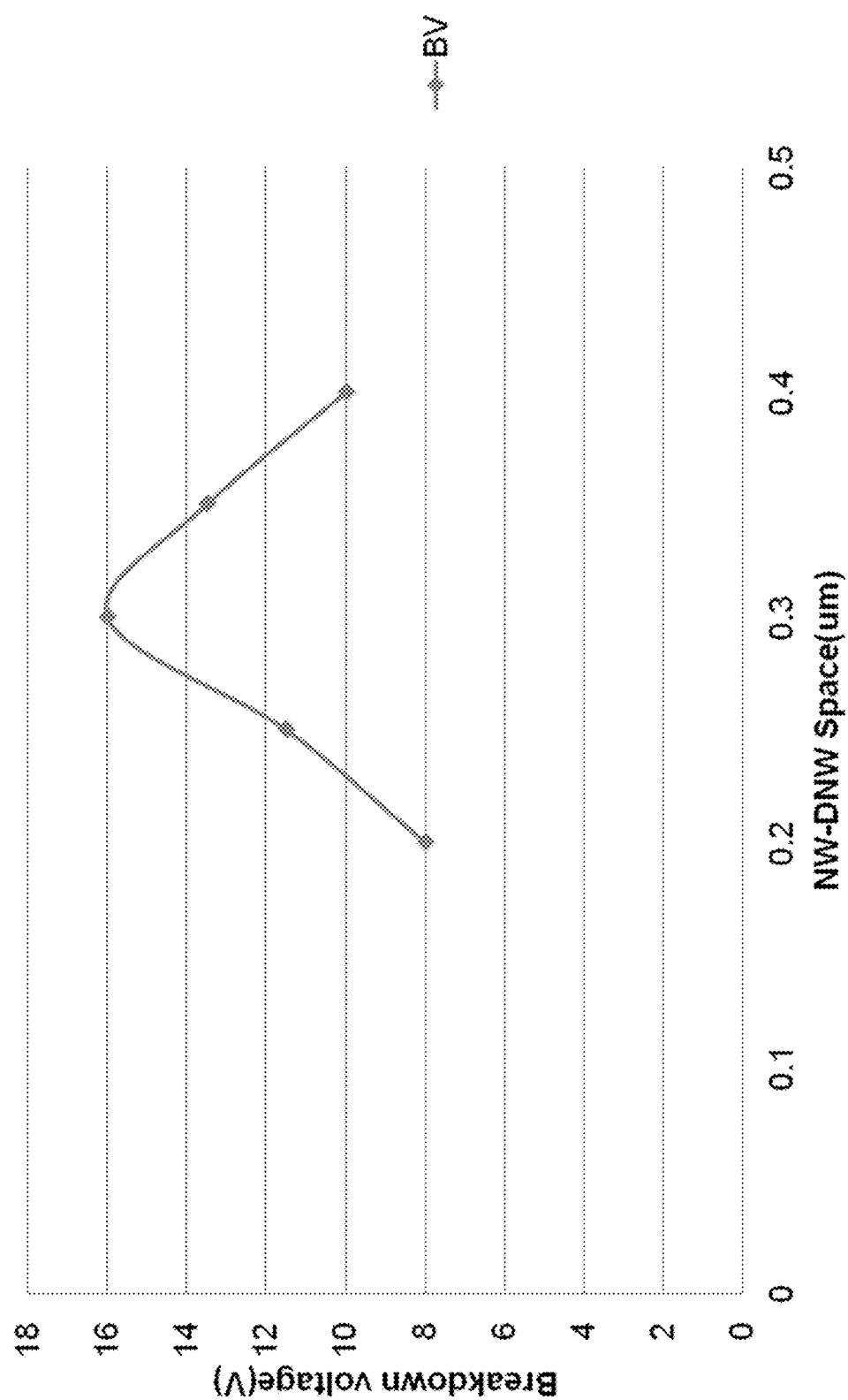
FIG. 5 shows a simulation graph implementing the structure shown in FIGS. 1A and 1B.

FIG. 5 shows a simulation graph implementing the structure shown in FIGS. 1A and 1B. In the graph, the x-axis is representative of a spacing (distance) between the deep well and the N-well ring as measured in microns; whereas, the y-axis is representative of the breakdown voltage (V). As shown in the graph, breakdown voltage increases as the distance between the deep well and the N-well ring increases from 0.2 microns to 0.3 microns.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising a plurality of N-type well ring structures of a first dopant type in a substrate completely surrounding a first well of the first dopant type, and spaced a distance "x" from the first well to cut a leakage path to a shallower second well of a second dopant type.

2. The structure of claim 1, wherein the shallower second well is a P-well located outside of the N-type well ring structure.

3. The structure of claim 1, wherein the first well is composed of a deep well implant, an N-well implant and an N+ contact.

4. The structure of claim 1, wherein plurality of N-type well ring structures include a deep well implant.

5. The structure of claim 1, wherein the plurality of N-type well ring structures include two N-type well rings each with a deep well implant.

6. The structure of claim 1, wherein the first well is composed of a N-well implant and an N+ contact.

7. The structure of claim 1, wherein the plurality of N-type well ring structures act as minority carrier sinkers, which suppress noise in a diode and sits adjacent to the well of the first dopant type.

8. The structure of claim 1, further comprising a diode structure composed of the first well of the first dopant type in the substrate.

9. The structure of claim 1, wherein the first dopant type is an N-type dopant.

10. A diode structure comprising an N-type ring structure completely surrounding a first N-well and a N+ contact, the N-type ring structure being spaced a distance "x" from the first N-well, and the first N-well comprising a deep well implant, an N-well implant and the N+ contact, and the N-type ring structure includes a deep well implant.

11. The structure of claim 10, wherein the N-type ring structure extends into a substrate more than shallow trench isolation regions, the first N-well and the N+ contact.

12. The structure of claim 11, wherein the shallow trench isolation regions surround the first N-well and the N+ contact.

13. The structure of claim 10, wherein the N-type ring structure is a plurality of N-type ring structures completely surrounding the first N-well.

14. The structure of claim 10, further comprising a P-type well located outside of the N-type ring structure.

15. The structure of claim 10, wherein the N-type well ring structure includes two N-type rings each with a deep well implant.

16. The structure of claim 10, wherein the N-type ring structure acts as minority carrier sinkers, which suppresses noise in a diode and sits adjacent to a well of the first dopant type.

17. A diode structure comprising an N-type ring structure which completely surrounds a first N-well and a N+ contact and a deep N-well, the N-type ring structure being spaced a distance "x" from the deep N-well, wherein the distance "x" varies between 50 nm to 2 microns.

18. The structure of claim 17, further comprising a P-well that is shallower than and located outside of the N-type ring structure, and the N-type ring structure includes a deep well implant.

19. The structure of claim 17, wherein the N-type ring structure is a plurality of N-type ring structures completely surrounding the N-well.

20. The structure of claim 17, wherein the distance "x" is 0.3 microns.

* * * * *